United States Patent
Machida et al.

(10) Patent No.: US 6,468,825 B1
(45) Date of Patent: Oct. 22, 2002

(54) METHOD FOR PRODUCING SEMICONDUCTOR TEMPERATURE SENSOR

(75) Inventors: Satoshi Machida, Chiba (JP); Yukito Kawahara, Chiba (JP); Kentaro Kuhara, Chiba (JP); Toru Shimizu, Chiba (JP); Yoshikazu Kojima, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/502,709

(22) Filed: Feb. 11, 2000

Related U.S. Application Data

(62) Division of application No. 08/712,871, filed on Sep. 12, 1996, now Pat. No. 6,046,492.

(30) Foreign Application Priority Data

| Sep. 12, 1995 | (JP) | 7-234463 |
|---|---|---|
| Aug. 5, 1996 | (JP) | 8-206212 |
| Aug. 7, 1996 | (JP) | 8-208619 |
| Aug. 7, 1996 | (JP) | 8-208620 |
| Aug. 8, 1996 | (JP) | 8-210258 |
| Aug. 26, 1996 | (JP) | 8-223950 |
| Aug. 26, 1996 | (JP) | 8-223952 |
| Sep. 5, 1996 | (JP) | 8-235583 |

(51) Int. Cl.[7] .................. H01L 21/00; H01L 21/8238
(52) U.S. Cl. .................. 438/48; 438/202; 438/204; 438/548
(58) Field of Search ............... 438/203, 207, 438/48, 202, 204, 548; 361/103; 73/204.15; 327/512, 545; 257/567, 568, 569, 570

(56) References Cited

U.S. PATENT DOCUMENTS

| 4,322,634 A | * | 3/1982 | Kaire et al. | 327/545 |
|---|---|---|---|---|
| 4,639,755 A | * | 1/1987 | Namiki et al. | 327/512 |
| 4,764,482 A | * | 8/1988 | Hsu | 438/203 |
| 4,916,085 A | * | 4/1990 | Frisina | 257/362 |
| 5,028,977 A | * | 7/1991 | Kenneth et al. | 257/370 |
| 5,039,878 A | * | 8/1991 | Armstrong et al. | 323/907 |
| 5,227,657 A | * | 7/1993 | Denham | 257/491 |
| 5,262,345 A | * | 11/1993 | Nasser et al. | 148/DIG. 9 |
| 5,321,650 A | * | 6/1994 | Kikichi et al. | 365/177 |
| 5,359,891 A | * | 11/1994 | Yamamoto et al. | 73/204.15 |
| 5,387,552 A | * | 2/1995 | Iranmanesh | 148/DIG. 9 |
| 5,390,069 A | * | 2/1995 | Marshall | 361/103 |
| 5,691,226 A | * | 11/1997 | Foerstner et al. | 148/DIG. 9 |
| 6,117,716 A | * | 9/2000 | Manning | 438/202 |

OTHER PUBLICATIONS

J. Bian and W.H. Lu, "A Process Scheme Chosen for BiCMOS Circuit", Hua Ko Electronics Co. LTD. Hong Kong, IEEE, 1994, pp. 4–7.*

S. Wolf ("Silicon processing for the VLSI Era vol. 2–Process integration", vol. 2, Lattice Press, 1990, pp. 523–560).*

D. Hodges, "Darlington's Contributions to Transistor Circuit Design", IEEE Transactions on Circuit and Systems–I: Fundamental Theory and Applications, vol. 46, No. 1, Jan. 1999, pp. 102–104.*

* cited by examiner

*Primary Examiner*—Eddie Lee
*Assistant Examiner*—José R. Díaz
(74) *Attorney, Agent, or Firm*—Adams & Wilks

(57) ABSTRACT

A method for producing a semiconductor temperature sensor comprises the steps of forming PNP bipolar transistors and PMOS transistors so that a base region of each of the PNP bipolar transistors and a corresponding N-well region of each of the PMOS transistors are formed at the same time, and connecting the PNP bipolar transistors in a Darlington connection.

18 Claims, 13 Drawing Sheets

2μm

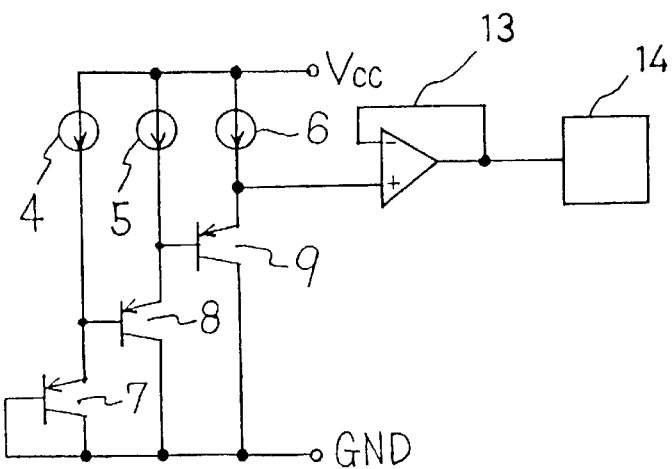
FIG. 21
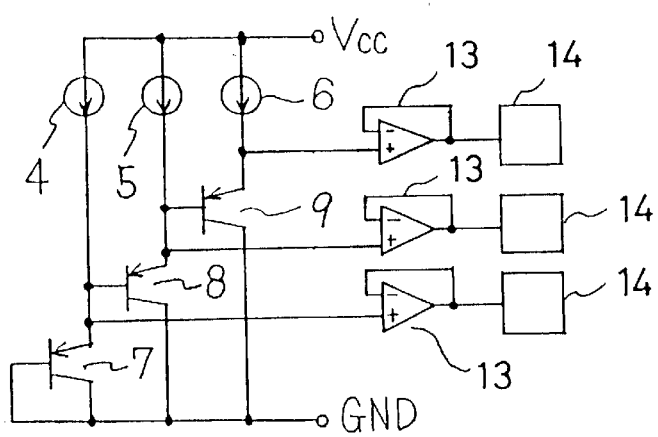
FIG. 22
FIG. 23
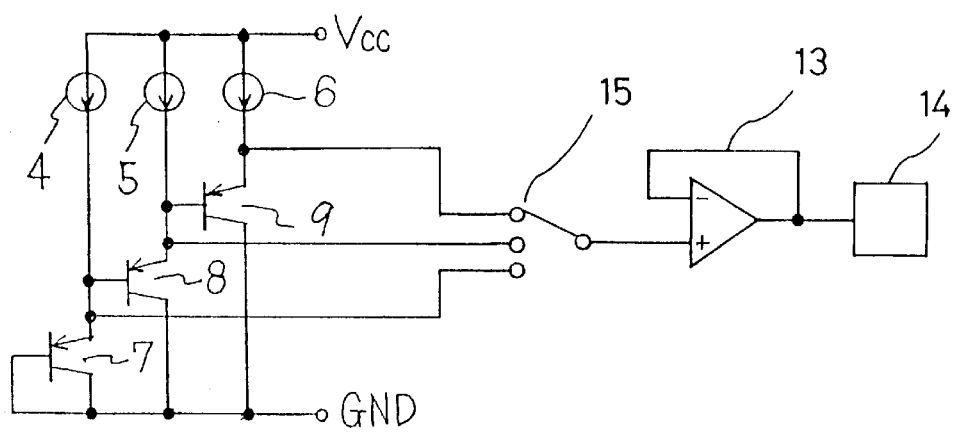

METHOD FOR PRODUCING SEMICONDUCTOR TEMPERATURE SENSOR

The present application is a division of prior U.S. application Ser. No. 08/712,871, filed on Sep. 12, 1996, now U.S. Pat. No. 6,046,492, which is hereby incorporated by reference, and priority thereto for common subject matter is hereby claimed.

BACKGROUND OF THE INVENTION

The present invention relates to an IC temperature sensor used for electrical products.

An IC temperature sensor which can be formed by the same process as CMOS and which NPN bipolar transistors are connected in a Darlington circuit is described in Japanese Patent No. S59-47467. FIG. 5 is a circuit diagram of NPN bipolar transistors connected in a double Darlington circuit and a constant current circuit is connected to an emitter of a transistor 102. This circuit detects the sum Vout of a voltage between a base and an emitter of a transistor 101 and voltage between a base and emitter of the transistor 102. An example of double collector construction applied to transistor 102 of FIG. 5 is shown in FIG. 13. In the above IC temperature sensor, current I1 between base and emitter of first transistor 101 is $0.1/\beta$ of current I2 between base and emitter of second transistor 102. As it is so small, the IC temperature sensor has had a problem to be sensitive to noise. Here, $\beta$ is current-amplification factor of transistor 102. Further, the IC temperature sensor has had a problem that current-amplification factor $\beta$ deviated, I1 deviated, and detecting voltage Vout deviated much.

Although a construction of transistor for making $\beta$ small is shown, the above problem has not been solved because $\beta$ does not become small, only about 10. When more than triple transistors are connected, deviation of detecting voltage Vout is large. The triple transistors is the limit practically.

The IC temperature sensor has had another problem that current consumption of the IC became large because large current must flow through the last transistor to make stable by flowing some current through the first transistor. Because of the problem, the area of the last transistor becomes large and the cost of the IC becomes high.

The IC temperature sensor has had a problem that current flowing through transistors except last transistor changed according to temperature and the more the connection of transistor were, the worse the linearity of detecting voltage Vout became.

The IC temperature sensor has had a problem that processes increase because different impurity concentration regions such as base region and emitter region of bipolar transistors, and well region and each source drain region of N and P types of CMOS had to be formed.

The IC temperature sensor has had a problem that temperature linearity of detecting voltage became bad because there was a difference between mobility temperature characteristics of well region of CMOS transistor assuming temperature characteristics of a constant current circuit and mobility temperature characteristics of base region assuming temperature characteristics of a bipolar transistor. The IC temperature sensor has had a problem that detecting voltage predetermined current became small by making impurity concentration of base region high and constant current for gaining the specified detecting voltage became large The IC temperature sensor has had a problem that effective area of junction between base and collector was influenced by diffusion distance of minority carrier in base, and $\beta$ was easy to deviate.

Therefore, in order to solve the problems, the object of the present invention is to provide an IC temperature sensor which is low cost, small current consumption, small deviation of detecting voltage, and superior anti-noise characteristics and linearity of detecting voltage.

SUMMARY OF THE INVENTION

The semiconductor temperature sensor of the invention comprises plural bipolar transistors connected in Darlington circuit, and each emitter electrode of the bipolar transistors is connected to a constant current source.

In this construction, voltage between base and emitter of each bipolar transistor is determined by current of constant current source connected and diode characteristics between base and emitter if current-amplification factor of bipolar transistor is large to a certain extent. Therefore, when the sum of voltage between base and emitter of all bipolar transistors is picked up as the output, temperature output characteristics being small in deviation is gained. The semiconductor temperature sensor of the invention comprises plural bipolar transistors connected in Darlington circuit, and a space between base diffusion layer of the bipolar transistor and chip edge of IC semiconductor temperature sensor is more than 20 $\mu$m. The semiconductor temperature sensor comprises plural bipolar transistors connected in Darlington circuit, and a diffusion layer of electric conductor type differing from a semiconductor substrate is formed between base diffusion layer of said bipolar transistor and chip edge of IC semiconductor temperature sensor. To the diffusion layer, a voltage is supplied like that junction with the semiconductor substrate makes reverse bias.

In this way, minority carrier generated by lattice defect in chip edge at high temperature becomes difficult to reach base region of the bipolar transistor. Therefore, extra current is added to emitter current of each transistor at high temperature, and output temperature characteristics keeps linear.

The IC temperature sensor comprises plural bipolar transistors connected in Darlington circuit, each emitter electrode of plural bipolar transistors is connected to the current source, and voltage of the respective emitter electrode is picked up as output. In this way, plural output voltages plural sensibilities are gained from the IC temperature sensor.

The IC temperature sensor of the invention comprises plural bipolar transistors connected in Darlington circuit, each emitter electrode of plural bipolar transistors is connected to the current source, and output voltage or sensibility of the IC temperature sensor becomes adjustable by changing current of current source by trimming.

Output voltage of the IC temperature sensor is the sum of voltage between base and emitter of plural bipolar transistors. Sensitivity of the IC temperature sensor is the sum of variation per unit temperature of voltage between base and emitter of plural bipolar transistors. When current flowing through emitter of the bipolar transistor changes, voltage between base and emitter changes. Therefore, output voltage can be adjusted by trimming the current.

When current flowing through emitter of the bipolar transistor changes, variation per unit temperature of voltage between base and emitter changes. Therefore, sensibility can be adjusted by trimming the current.

BRIEF DESCRIPTION OF THE DRAWINGS

FIG. 21 is a circuit diagram of the ninth embodiment of semiconductor temperature sensor of the present invention.

FIG. 22 is a circuit diagram of the tenth embodiment of semiconductor temperature sensor of the present invention.

FIG. 23 is a circuit diagram of the eleventh embodiment of semiconductor temperature sensor of the present invention.

DETAILED DESCRIPTION OF THE PREFERRED EMBODIMENTS

Figure 1:
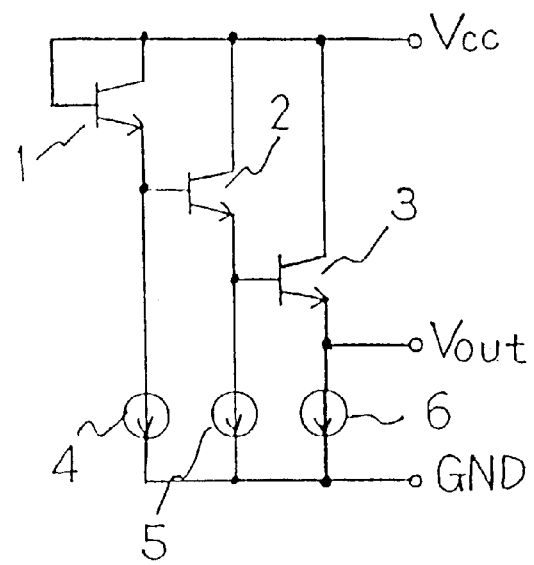
FIG. 1 is a circuit diagram showing the first embodiment of semiconductor temperature sensor of the present invention.

Referring to the drawings, the present invention is described.

FIG. 1 is a circuit diagram of the first embodiment of semiconductor temperature sensor in the present invention. NPN bipolar transistors 1, 2, and 3 are connected in Darlington circuit. Emitters of bipolar transistors 1, 2, and 3 are connected to respective current sources 4, 5, and 6. Another terminal of current sources 4, 5, and 6 are all connected to a GND terminal. Collectors of bipolar transistors 1, 2, and 3 are all connected to a source voltage terminal Vcc. A constant voltage is supplied to GND terminal and Vcc terminal from the outside. Emitter terminal of the last bipolar transistor 3 is output terminal Vout and it is connected to input of an amplifier.

Figure 2:
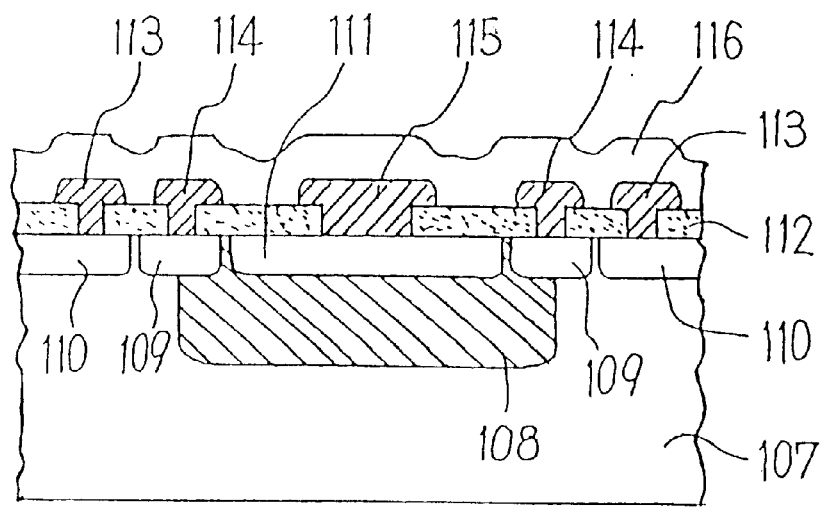
FIG. 2 is a partial sectional view of a NPN bipolar transistor of the semiconductor temperature sensor of the present invention.

The semiconductor temperature sensor can be formed by a CMOS process. FIG. 2 is a partially sectional view of NPN bipolar transistor of the semiconductor temperature sensor. N− silicon substrate 107 is a collector region, P diffusion layer 108 is a base region, and N+ diffusion layer 111 is an emitter region. Symbol 109 is a P+ diffusion layer, symbol 110 is an N+ diffusion layer, symbol 112 is a middle insulation layer, symbol 113 is a collector electrode, symbol 114 is a base electrode, symbol 115 is an emitter electrode, and symbol 116 is a protection film. The P diffusion layer 108 can be formed at the same time as the P well forming of CMOS. The P+ diffusion layer 109 can be formed at the same time,as the forming of source and drain of P channel transistor. N+ diffusion layers 110 and 111 can be formed at the same time as the forming of source and drain of N channel transistor. The current sources 4, 5, and 6 can also be formed by CMOS process. The collector domain can be formed by N− diffusion layer not by N− silicon substrate 107.

Figure 6:
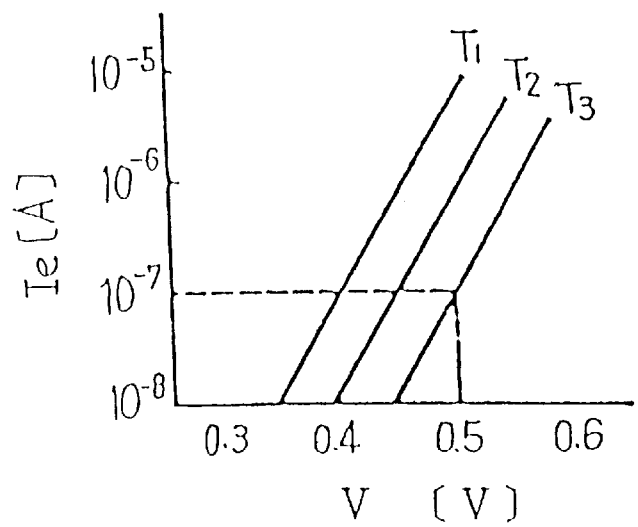
FIG. 6 shows current voltage characteristics between base and emitter.

Next, the principle of the semiconductor temperature sensor is described. The sum of voltage between base and emitter of each transistor is picked up as the output Vout as it is obvious by FIG. 1. In forward bias condition under diffusion current control, the voltage between base and emitter V is defined as follows as current voltage characteristics of a diode, defining emitter current as Ie.

$$Ie = eni^2(Dp/LpNd + Dn/LnNa) \cdot \exp(eV/kT)$$

e: unit electric charge
T: absolute temperature
ni: true carrier density
k: Boltzmann constant
Nd: donor density of N type region
Na: acceptor density of P type region
Dp: diffusion constant of hole
Dn: diffusion constant of electron
Lp: diffusion distance of hole
Ln: diffusion distance of electron Therefore, current voltage characteristics between base and emitter changes by temperature as shown in FIG. 6. Here, T1, T2, and T3 are temperatures and the relation between them are T1>T2>T3. If emitter current Ie is constant, voltage between base and emitter is almost linear to temperature, and sensibility of −2 to −3 mV/° C. is gained.

Defining emitter current flowing through transistors 1, 2, and 3 as Ie1, Ie2, and Ie3: base current as Ib1, Ib2, and Ib3: current flowing through current sources 4, 5, and 6 as I4, I5, and I6: and common emitter current-amplification factor of transistors 1, 2, and 3 as β1, β2, β3.

```
Ie3  = I6
Ie2  = I5 + Ib3
     = I5 + Ie3/ (β3 + 1)
     = I5 + I6/ (β3 + 1)
Ie1  = I4 + Ib2
     = I4 + Ie2/ (β2 + 1)
     = I4 + I5/ (β2 + 1) + I6/ (β3 + 1) / (β2 +1)
```

Here, the following equalities are used.

$$Ib3=Ie3/(β3+1), Ib=Ie2/(β2+1)$$

Being obvious by the above equation, if β2 and β3 are large a certain degree, the following equations are gained.

Ie2≈I5

Ie1≈I4

Emitter current of all transistors is determined by current value of current source not depending on current-amplification factor. Therefore, a constant output Vout can be gained not depending on current-amplification factor. Although current-amplification factor deviates more than ±50% generally, influence of deviation of current-amplification factor is negligible if the target of current-amplification factor is set more than 20. Therefore, current-amplification factor of all transistors becomes the same and it is easy to produce. Although current-amplification factor has a positive temperature coefficient, influence of this character too is negligible. As current-amplification factor β may be large, it is not needed to form double collectors construction, and base concentration can be made low. If the invention is designed so that sizes;of transistors 1, 2, and 3 are all the same and currents I4, I5, and I6 flowing through current sources 4, 5, and 6 are the same, three times of output of junction voltage V of diode between base and emitter and sensibility are gained accurately, and it is easy to design. If emitter areas are the same, there is no need to make all sizes of transistors 1, 2, and 3 same, the above effect is gained and the invention is designed freely.

The above explanation is done in the case of three transistors. There is not any problems in the case of two transistors or in the case of more than four transistors if output voltage is within rating voltage. As junction current of diode between base and emitter is under diffusion current control, the sizes of transistors 1, 2, and 3 can be made small as far as the design can be done so that current of current source is made small.

Figure 3:
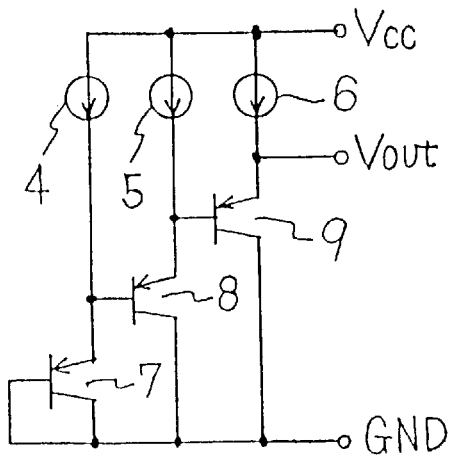
FIG. 3 is a circuit diagram of the second embodiment of semiconductor temperature sensor of the present invention.

FIG. 3 is a circuit diagram of the second embodiment of semiconductor temperature sensor in the present invention. Position of Vcc terminal and GND terminal of FIG. 1 are changed each other and NPN bipolar transistors 1, 2, and 3 are changed to PNP bipolar transistors 7, 8, and 9. The semiconductor temperature sensor can be formed by CMOS process specifying P– silicon substrate as collector region. Although the principle of the semiconductor temperature sensor is similar to the principle of the semiconductor temperature sensor of the second embodiment, it has a characteristic to gain output Vout from GND.

In the above explanation, it is desirable that current sources 4, 5, and 6 are constant current sources flowing constant current regardless of voltage applied to both terminals of the current sources. Further, it is desirable that current does not change much by temperature. In such current source, temperature characteristics of diode between base and emitter becomes temperature characteristics of output. Therefore, the semiconductor temperature sensor is easy to be designed because of small deviation.

Figure 4:
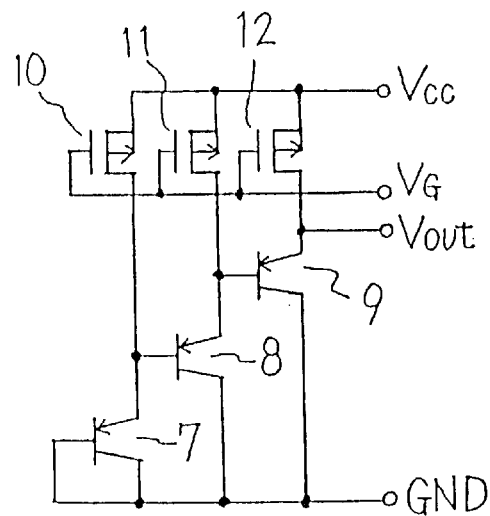
FIG. 4 is a circuit diagram of the third embodiment of semiconductor temperature sensor of the present invention.
Figure 5:
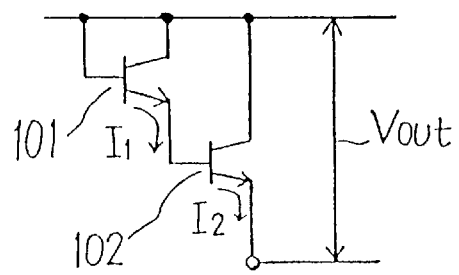
FIG. 5 is a circuit diagram of a prior art semiconductor temperature sensor.

FIG. 4 is a circuit diagram of the third embodiment semiconductor temperature sensor using P channel MOS transistors 10, 11, and 12 as current source satisfying the above requirement. The MOS transistors 10, 11, and 12 may be replaced with junction FET.

Gate voltage VG is set so that MOS transistors 10, 11, and 12 always operate at saturation areas and current flowing through diode between base and emitter of transistors 7, 8, and 9 is always under diffusion control. Gate voltage VG can be gained forming a reference voltage generating circuit in the semiconductor temperature sensor. As MOS transistors 10, 11, and 12 operate in saturation areas, almost constant current flows regardless of the voltage between source and drain. If difference between Vcc and VG is set to be constant, a constant output voltage Vout is gained regardless of the change of Vcc.

Figure 7:
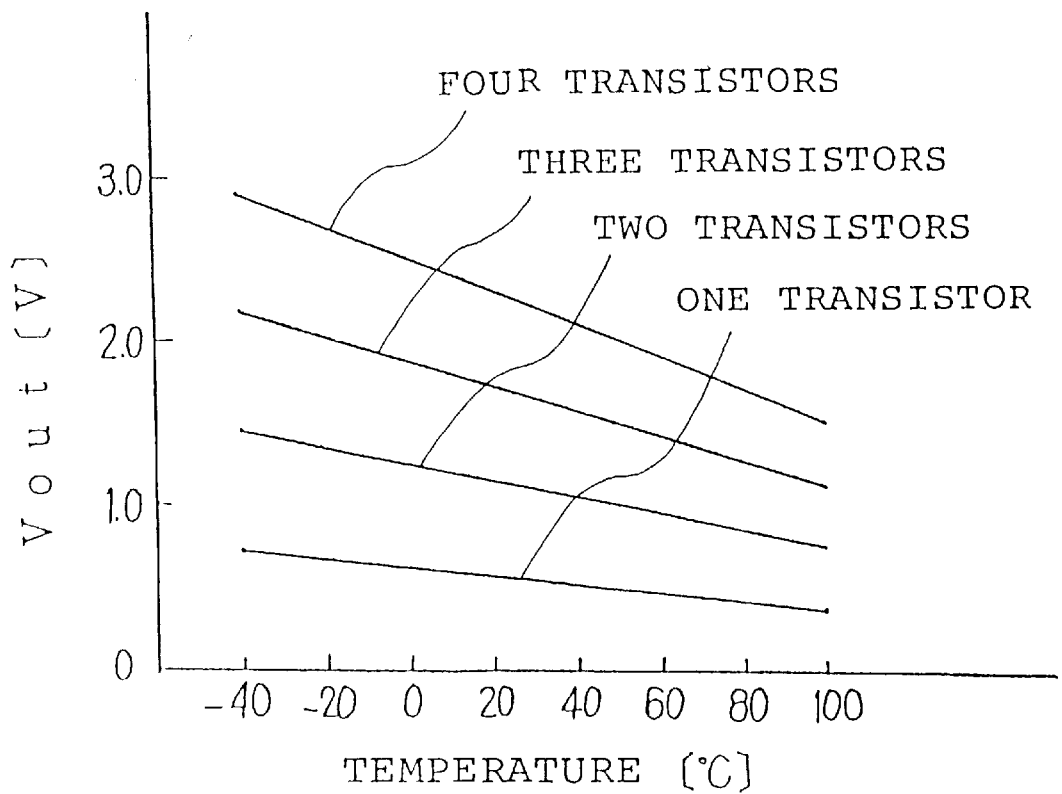
FIG. 7 is a temperature dependence of output voltage of semiconductor temperature sensor of the present invention.

Temperature dependence of output voltage Vout of semiconductor temperature sensor of FIG. 4 is shown in FIG. 7. Cases of one, two, and four bipolar transistors are shown except three transistors. Each bipolar transistor and each MOS transistor are the same size respectively, and current-amplification factor of the bipolar transistor is about 50. Output of plural transistors is output of one transistor multiplied by the number of transistors.

Although the output Vout is picked up from emitter of the last bipolar transistor, it is possible to pick up output Vout from emitter of each bipolar transistor.

Figure 8:
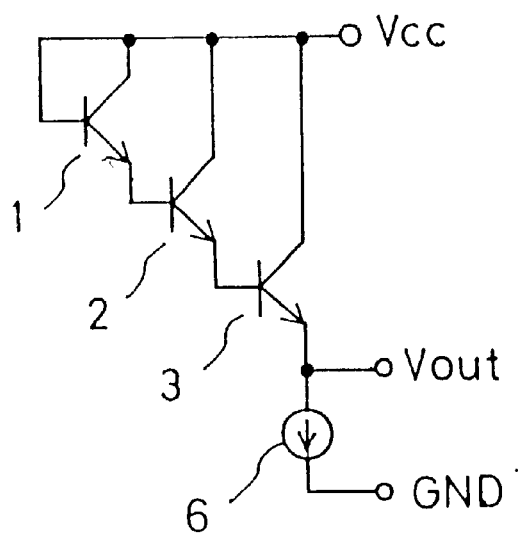
FIG. 8 is a circuit diagram of the fourth embodiment of semiconductor temperature sensor of the present invention.

FIG. 8 is the fourth embodiment of semiconductor temperature sensor of the present invention. NPN bipolar transistors 1, 2, and 3 are connected in Darlington circuit. Emitter of bipolar transistor 3 is connected to current source 6. Another terminal of current source 6 is connected to GND terminal. All collectors of bipolar transistors are connected to power source voltage terminal Vcc. Constant voltage is supplied to GND terminal and Vcc terminal from outside power source. Emitter terminal of last bipolar transistor 3 is an output terminal connected to an input of an amplifier.

Figure 9:
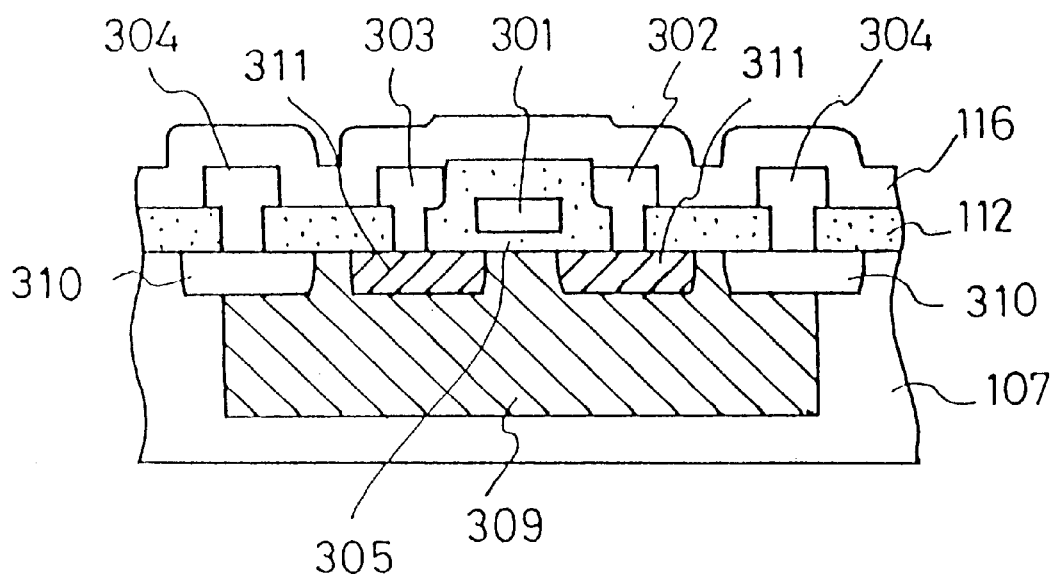
FIG. 9 is a partial sectional view of a MOS transistor of semiconductor temperature sensor of the present invention.

The fourth embodiment of semiconductor temperature sensor of the present invention can be formed by usual CMOS process like the semiconductor temperature sensor of the first embodiment. FIG. 2 is a partially sectional view of NPN bipolar transistor of semiconductor temperature sensor of the fourth embodiment and is similar to the first embodiment. FIG. 9 is a partially sectional view of NMOS. In FIG. 9, 301 is a polysilicon electrode, 302, 303 denote base electrodes, 304, 304 denote collector electrodes, and 305 is an emitter electrode. In FIG. 2, N– silicon substrate 107 is a collector region, P diffusion layer 108 is a base region, and N+ diffusion layer 111 is an emitter region. Symbol 109 is a P+ diffusion layer, symbol 110 is an N+ diffusion layer, symbol 112 is a middle insulation layer, symbol 113 is a collector electrode, symbol 114 is a base electrode, symbol 115 is an emitter electrode, and symbol 116 is a protection film. The P diffusion layer 108 is formed at the same time at base region of bipolar-power transistor and P well region 309 of NMOS shown in FIG. 9 by ion implantation and thermal diffusion. Impurity concentration of these diffusion layers is less than 2e16 cm$^{-3}$. The P+ diffusion layer 109 is formed at the same time at emitter region of bipolar transistor, source-drain region of PMOS transistor, and substrate electrode region 310 of NMOS ion implantation or solid diffusion. The N+ diffusion layer 110 is formed at the same time as source-drain region 311 of NMOS transistor. Impurity concentration of these diffusion layers is about 1e20 cm$^{-3}$. Collector region may be formed by N– diffusion layer not by N– silicon substrate 107.

Figure 10:
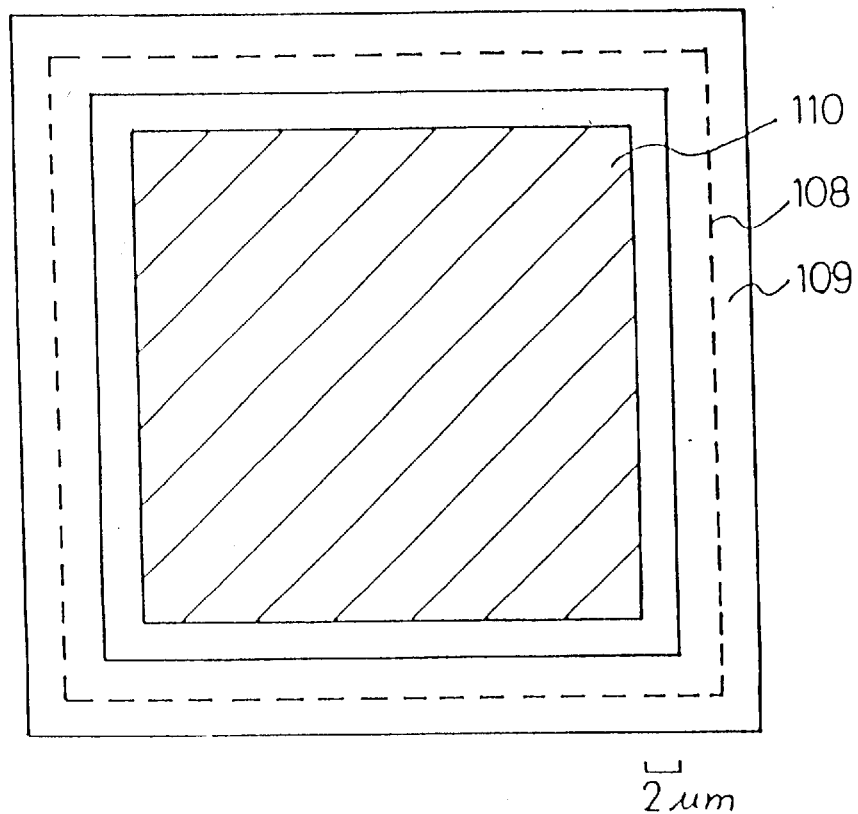
FIG. 10 is a layout view of base-emitter portion of NPN bipolar transistor of semiconductor temperature sensor in the present invention.

FIG. 10 is a layout view of NPN bipolar transistor portion of the semiconductor temperature sensor. P diffusion layer 108 is formed within 6 $\mu$m outside from the end of N+ diffusion layer 110. The N+ diffusion layer 110 of emitter region and P diffusion layer 108 of base region are laid out in square.

Next, the operation principle of the semiconductor temperature sensor of the fourth or first embodiment is described. Being obvious by FIGS. 1 and 8, the sum of voltage between base and emitter of each transistor is picked up as output Vout. As mentioned above, the voltage between base and emitter is defined as follow in forward bias condition under diffusion current control like current voltage characteristics of diode defining the emitter current as Ie.

$$Ie=eni^2(Dp/LpNd+Dn/LnNa)\cdot\exp(eV/kT)$$

Substituting the following equations and considering the concentration of emitter and base, $$ni^2=no^2T^3\cdot\exp(\_eEg/kT)$$

$$Dn=un\cdot kT/e$$

base region is under diffusion current control. If base width Wb is smaller than diffusion distance Ln, Ie is defined as following.

$$Ie=no^2unkT^4/WbNa\cdot\exp(e(V\_Eg)/kT)$$

un: mobility of electron
no: constant
Eg: energy gap
Wb: base width

The usual current voltage characteristic between base and emitter includes temperature characteristics of mobility of electron in the base. Temperature characteristics of mobility is difficult to cancel because temperature characteristics of mobility is complicatedly influenced by impurity concentration of the region. If NMOS transistor, well of which has the same concentration as bipolar transistor is used as a constant current circuit, temperature characteristics of mobility of bipolar transistor is canceled by temperature characteristics of the constant current circuit, and detecting voltage characteristics having a superior linearity. Forming the base domain of bipolar transistor and the P well region 309 of NMOS transistor of constant current circuit gains not only reduction of process but also detecting voltage characteristics having superior linearity. The matter is applied to the third embodiment shown in FIG. 4. When the matter is applied to the third embodiment, the base region of bipolar transistor and the well region of transistor of constant current circuit may be formed at the same time because current-amplification power of bipolar transistor may be large and concentration of the base region may be weak.

The weaker the base concentration is, the higher is the detecting voltage gained with a little constant current, and current consumption is decreased by making impurity concentration of the base.

Figure 11:
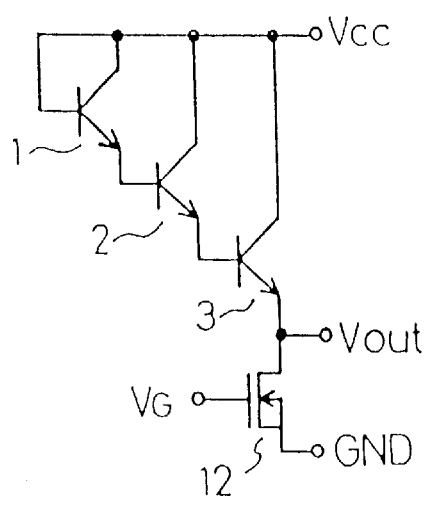
FIG. 11 is a circuit diagram of the fourth embodiment of semiconductor temperature sensor of the present invention.

In the circuit diagram of temperature sensor in FIG. 11, defining current-amplification of transistors 1, 2, and 3 in common emitter as $\beta$1, $\beta$2, and $\beta$3, current I1 between base and emitter of the first transistor 1 is small, that is 1/$\beta$2 of current I2 between base and emitter of the second transistor 2, and further, that is 1/$\beta$2×$\beta$3 of current I3 between base and emitter of the third transistor 3, and deviation of current-amplification factor $\beta$ influences deviation of detecting voltage. When the end of base deviates from the end of emitter, effective base-collector junction area where minority carrier flows is changed by diffusion distance of minority carrier and that causes the deviation of current-amplification factor $\beta$. Current-amplification factor $\beta$ is difficult to deviate from diffusion distance of minority carrier by forming the end of base at the same distance or shorter distance than diffusion distance, that is within 6 $\mu$m. Laying out emitter region and base region in similar figures each other shown in FIG. 10, influence of the end of emitter on emitter area is minimized, and current-amplification factor $\beta$ is difficult to deviate from diffusion distance of minority carrier.

Figure 12:
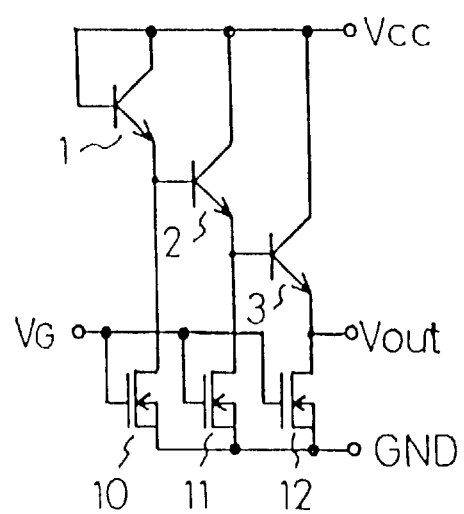
FIG. 12 is a circuit diagram of the fifth embodiment of semiconductor temperature sensor of the present invention.
Figure 13:
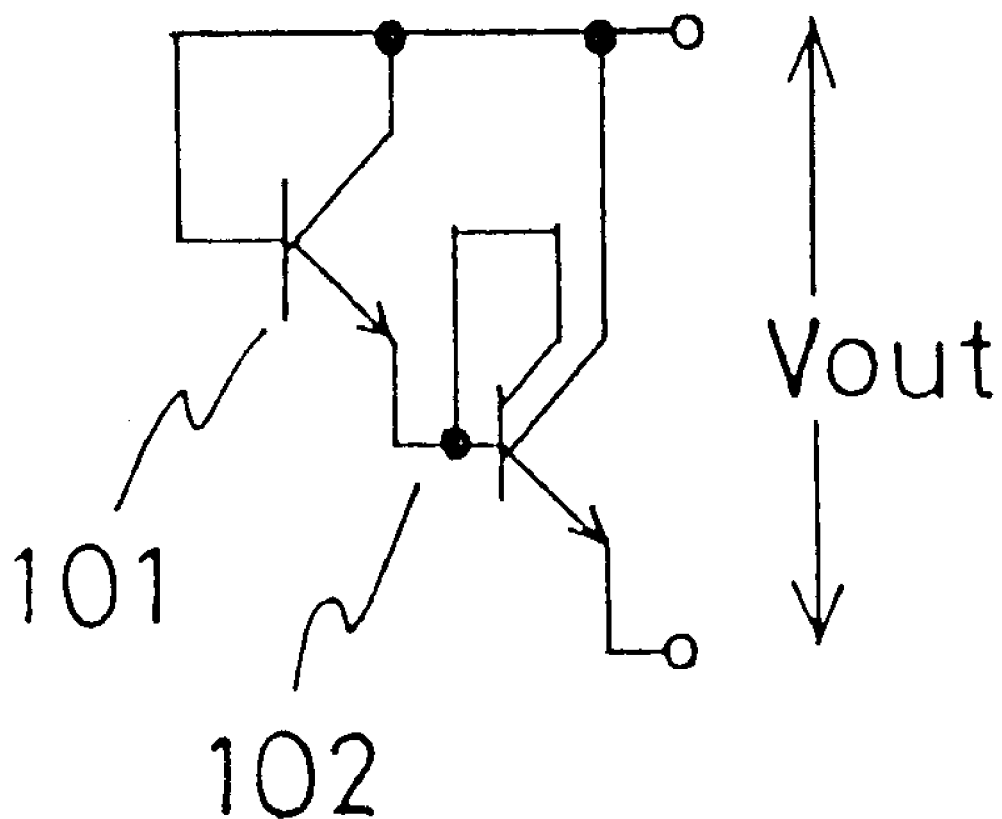
FIG. 13 is a circuit diagram of a prior art semiconductor temperature sensor.

FIG. 12 is a circuit block diagram of the fifth embodiment of semiconductor temperature sensor in the present invention. The constant current sources 4, 5, and 6 of FIG. 1 are comprises PMOS transistors 10, 11, and 12. The semiconductor temperature sensor is formed by CMOS process selecting N– silicon substrate for collector region.

Next, a sectional construction of bipolar transistor is described. The partially sectional view of NPN bipolar transistor of the semiconductor temperature sensor in the present invention is shown in FIG. 2.

Figure 14:
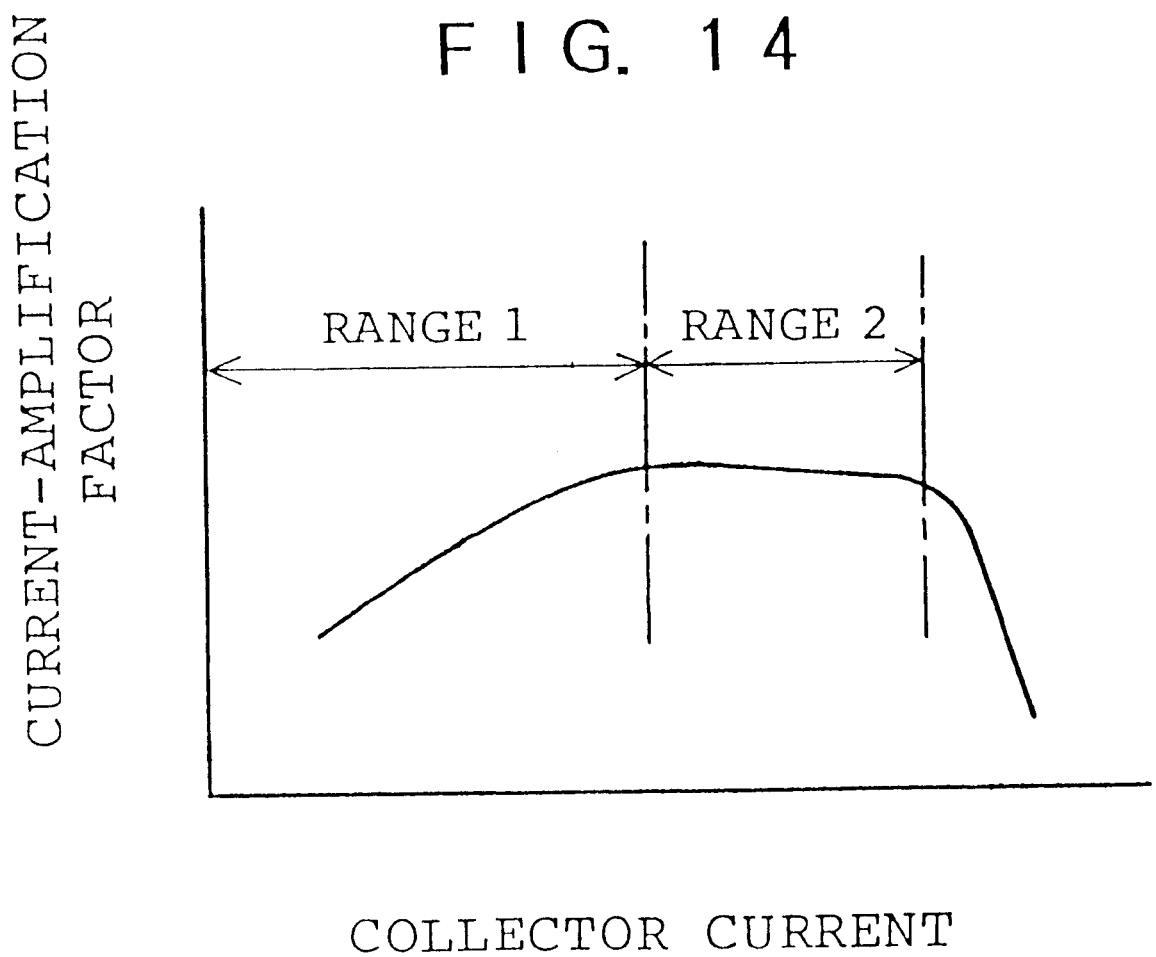
FIG. 14 is a view of electric characteristics of NPN bipolar transistor of semiconductor temperature sensor in the present invention.

FIG. 14 is a graphical representation showing characteristics of current-amplification factor toward collector current of bipolar transistor of the construction in FIG. 2. According to FIG. 14, it is obvious that current-amplification factor decreases when collector current becomes small, as shown in range 1. The decrease has large deviation among elements. Because of that, the transistor has to be operated in range 2 making collector current higher. Therefore, when IC temperature sensor is formed connecting bipolar transistors in Darlington circuit, current of $\beta$ times of the first transistor 101 has to flow in order that the first transistor 101 operates in the range 2. Because of that, large current has to flow through the whole of IC temperature sensor. Here, $\beta$ is current-amplification factor of transistor 102.

It is necessary to make the second transistor of size of $\beta$ times of the first transistor in order that $\beta$ times of current flows through the second transistor, and enlargement of chip size is required.

Figure 15:
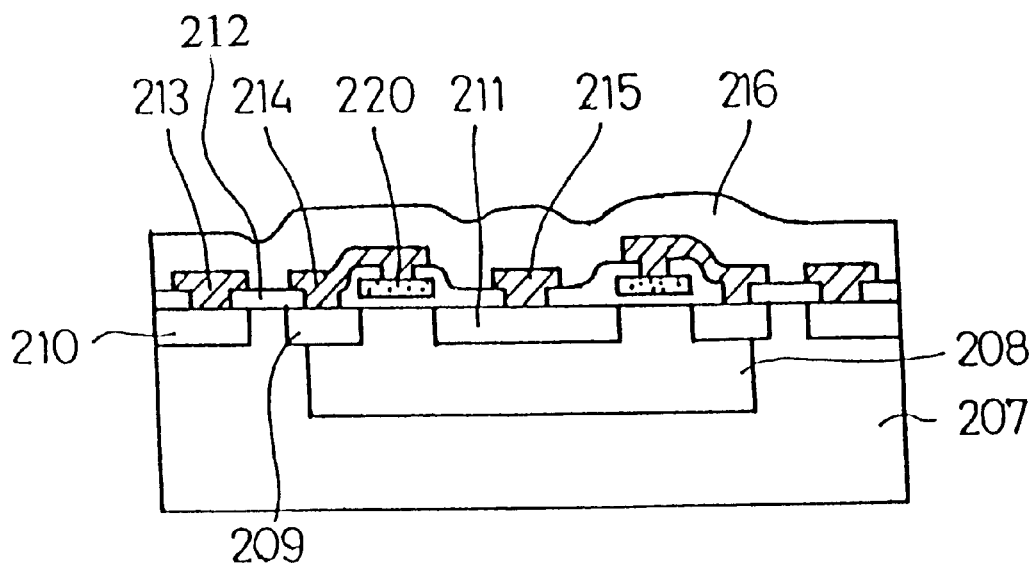
FIG. 15 is a circuit diagram of the sixth embodiment of semiconductor temperature sensor of the present invention.

FIG. 15 is a partially sectional view of the NPN bipolar transistor of the sixth embodiment of semiconductor temperature sensor in the present invention. N– silicon substrate 207 is a collector region, P diffusion layer 208 is a base region, and N+ diffusion layer 211 is an emitter region. Symbol 220 is a polysilicon electrode, symbol 209 is a P+ diffusion layer, symbol 210 is an N+ diffusion layer, symbol 212 is a middle insulation layer, symbol 213 is a collector electrode, symbol 214 is a base electrode, symbol 215 is an emitter electrode, and symbol 216 is a protection film. Polysilicon electrode 220 is connected to P diffusion layer 208 by base electrode 214.

Figure 16:
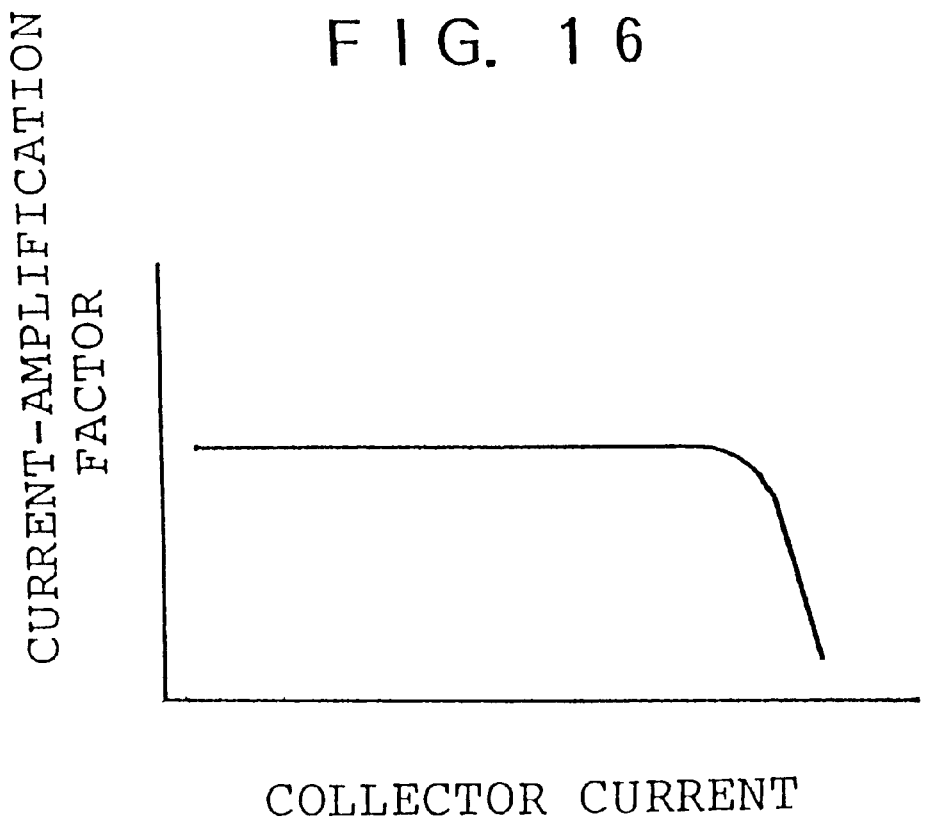
FIG. 16 is a view of electric characteristics of NPN bipolar transistor of semiconductor temperature sensor in the present invention.

FIG. 16 is a graphical representation showing characteristics of current-amplification factor toward collector current of bipolar transistor of the sixth embodiment.

Defining current-amplification factor as $\beta$, the following equation is gained.

$$1/\beta=(IVR+ISR+IpE)/IE$$

IVR: volume recombination current
ISR: surface recombination current
IpE: hole reverse injection current
IE : emitter current Decrease of collector current brings a decrease of β because contribution of creation-recombination current IVR, ISR at base region becomes large. Surface recombination current ISR influences β specially at low collector current region and deviates. ISR appears at surface of base around emitter, and is influenced by damage caused by plasma at production of semiconductor element and surface electric charge.

The transistor having structure of FIG. 15 protects damage caused by plasma at production of semiconductor element because surface of base around emitter is covered by polysilicon electrode 220. The transistor is not influenced by surface electric charge because electric potential is set to base potential. In result, decrease of β becomes small at the region where collector current is small as shown in FIG. 2. Therefore, the transistor of FIG. 15 does not deviate in small current and operates stably, and the semiconductor temperature sensor of low current consumption is gained. As it is possible to minimize bipolar transistor, semiconductor temperature sensor of low price is provided.

Figure 17:
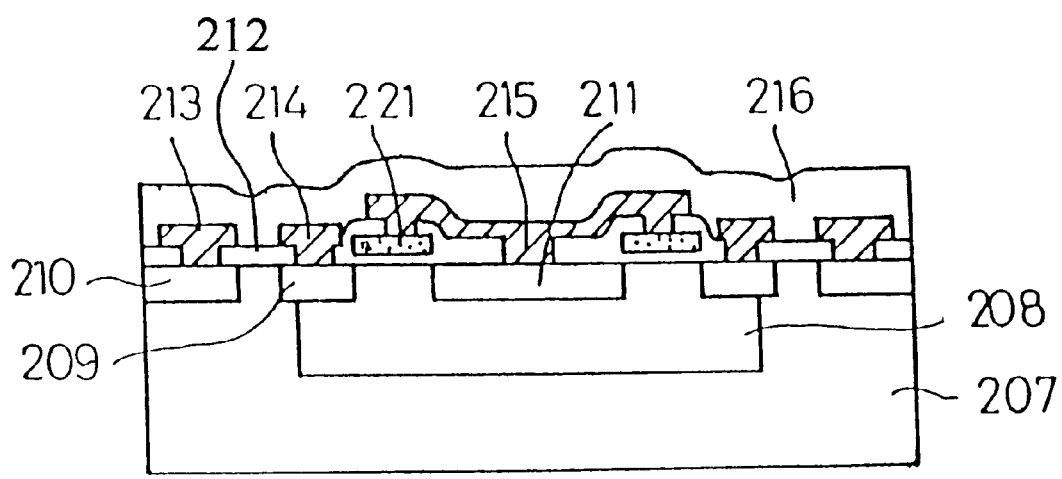
FIG. 17 is a circuit diagram of the seventh embodiment of semiconductor temperature sensor of the present invention.

FIG. 17 is a partially sectional view of NPN bipolar transistor of the seventh embodiment of semiconductor temperature sensor in the present invention. N− silicon substrate 207 is a collector region, P diffusion layer 208 is a base region, and N+ diffusion layer 211 is an emitter region. Symbol 221 is polysilicon electrode, symbol 209 is a P+ diffusion layer, symbol 210 is an N+ diffusion layer, symbol 212 is a middle insulation layer, symbol 213 is a collector electrode, symbol 214 is a base electrode, symbol 215 is an emitter electrode, and symbol 216 is a protection film. Polysilicon electrode 221 is connected to N+ diffusion layer 211 by emitter electrode 216.

The transistor having structure of FIG. 17 protects damage caused by plasma at production of semiconductor element because surface of base around emitter is covered by polysilicon electrode 221. The transistor is not influenced by surface electric charge because electric potential is set to emitter potential. In result, decrease of β becomes small at the region where collector current is small as similar as characteristics of current-amplification factor toward collector current of bipolar transistor of the sixth embodiment shown in FIG. 16. Therefore, the transistor of FIG. 17 does not deviate in small current and operates stably, and the semiconductor temperature sensor of low current consumption is gained. As it is possible to minimize bipolar transistor, semiconductor temperature sensor of low price is provided.

Figure 18:
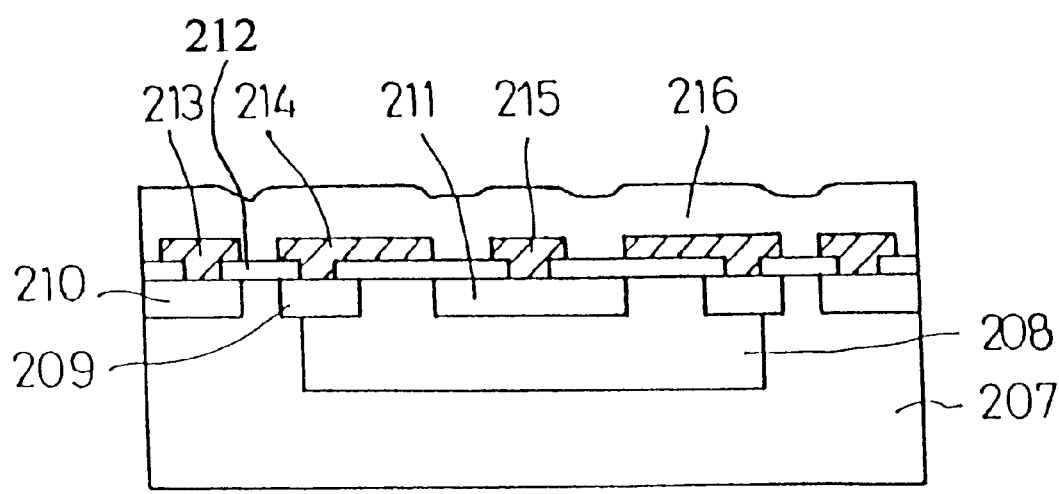
FIG. 18 is a circuit diagram of the eighth embodiment of semiconductor temperature sensor of the present invention.

FIG. 18 is a partially sectional view of NPN bipolar transistor of the eighth embodiment of semiconductor temperature sensor in the present invention. N− silicon substrate 207 is a collector region, P diffusion layer 208 is a base region, and N+ diffusion layer 211 is an emitter region. Symbol 209 is a P+ diffusion layer, symbol 210 is an N+ diffusion layer, symbol 212 is a middle insulation layer, symbol 213 is a collector electrode, symbol 214 is a base electrode, symbol 215 is an emitter electrode, and symbol 216 is a protection film. Base electrode 214 covers base around emitter.

The transistor having structure of FIG. 18 protects damage caused by plasma at production of semiconductor element because surface of base around emitter is covered by base electrode 214. The transistor is not influenced by surface electric charge because electric potential is set to emitter potential. In result, decrease of β becomes small at the region where collector current is small as similar as characteristics of current-amplification factor toward collector current of bipolar transistor of the sixth embodiment shown in FIG. 16. Therefore, the transistor of FIG. 18 does not deviate in small current and operates stably, and the semiconductor temperature sensor of low current consumption is gained. As it is possible to minimize bipolar transistor, semiconductor temperature sensor of low price is provided.

As judged easily from FIGS. 15, 17, and 18, the electrode covering base around emitter has the similar effect as emitter electrode in the eighth embodiment.

Although the above explanation is described about examples of NPN transistor, PNP transistor is similar to the NPN transistor.

Next, the construction near chip edge of semiconductor temperature sensor of the present invention is described.

Figure 19:
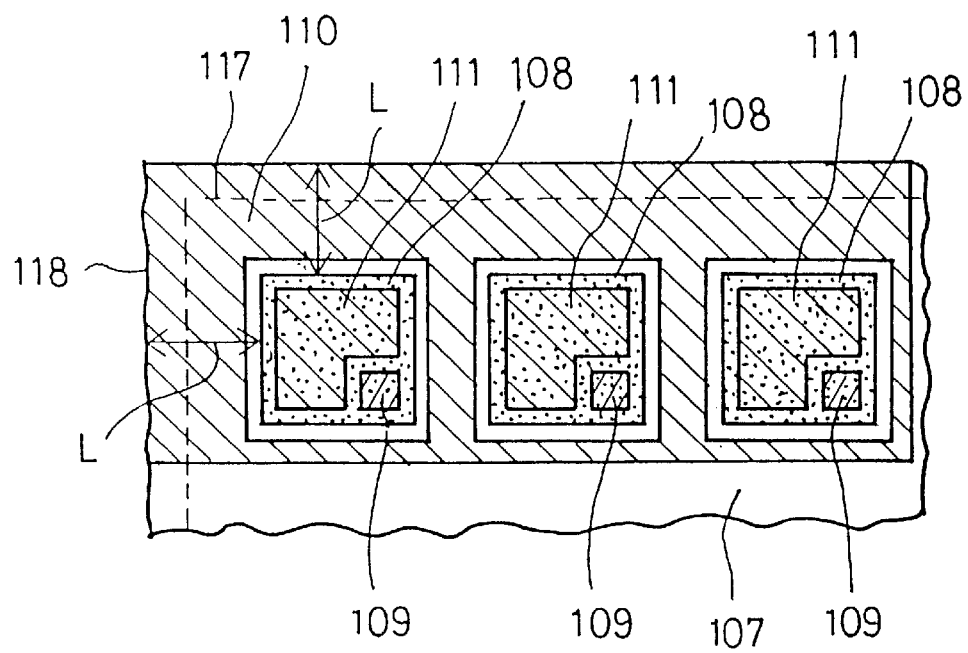
FIG. 19 is a plan view showing the relation between diffusion region and chip edge of semiconductor temperature sensor of the present invention.

FIG. 19 is a plan view showing the relation between diffusion region and chip edge of semiconductor temperature sensor of the present invention. This is the case that semiconductor temperature sensor is made of NPN bipolar transistor selecting N− silicon substrate for collector region, and N+ diffusion layer 111 of emitter region is formed inside of P diffusion layer 108 of base region. P+ diffusion layer 109 for connecting base electrode is formed on the P diffusion layer 108. N+ diffusion layer 110 for making stable electric potential Vcc of N− silicon substrate 107 is formed around P diffusion layer 108. The N+ diffusion layer 110 is applied electric potential of plus Vcc to and may be formed to chip edge 118. Symbol 117 is a border of passivation protection film.

Base domain and diffusion layer around the domain of each bipolar transistor are formed at the same pattern. Therefore, characteristics of each bipolar transistor is the same.

Gap L between base diffusion layer 108 and chip edge 118 of each bipolar transistor is more than 20 μm. That is because minority carrier (hole) appearing by lattice defect of chip edge at high temperature becomes difficult to reach base region. If the minority carrier reaches base region, current of current-amplification factor times of the minority carrier's electric charge is added to emitter current, and linear output temperature characteristics is not gained.

Figure 20:
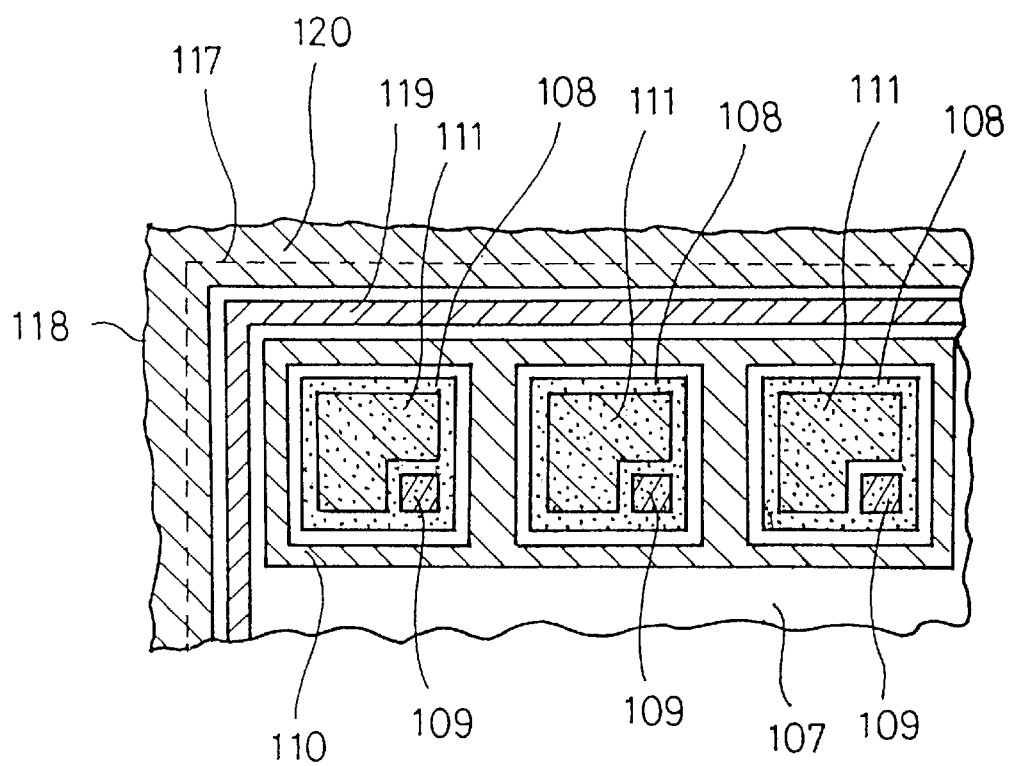
FIG. 20 is a plan view showing the relation between diffusion region and chip edge of semiconductor temperature sensor protecting the influence of minority carrier of the present invention.

Another way to prevent from the above phenomena is shown in FIG. 20. As similar to FIG. 19, P diffusion layer 108 of base domain, N+ diffusion layer 111 of emitter region, and P+ diffusion layer are formed respectively. N+ diffusion layer 110 for being collector region and making stable electric potential Vcc of N− silicon substrate 107 is formed around P diffusion layer 108. P type diffusion layer 119 is formed between outside of N+ diffusion layer 110 and chip edge. Electrical potential of GND is applied to the P type diffusion layer 119. Therefore, depletion layer is formed around P type diffusion layer and for inside of N− silicon substrate. The depletion layer is absorbed before minority carrier (hole) appearing by lattice defect of chip edge at high temperature reaches base region. Therefore, linear output temperature characteristics is kept even at high temperature. The above P type diffusion layer 119 may be formed at the same time as the forming of P+ diffusion layer 109 and may be formed at P well. Circuit and element may be formed inside of P type diffusion layer 119.

N+ diffusion layer 120 applied electrical potential Vcc outside of P type diffusion layer 119. The N+ diffusion layer 120 is formed in order that PN junction of chip edge side of P type diffusion layer 119 does not leak.

As minority carrier appearing caused by lattice defect decrease exponentially to temperature, the minority carrier becomes large as base current of each transistor at more than 80° C., and the influence is not negligible. In the above mentioned structure of FIGS. 19 and 20, linear output temperature characteristics is gained even at more than 80° C.

In the above explanation, when semiconductor temperature sensor is formed by PNP bipolar transistor selecting P– silicon substrate for collector region, it is possible to replace P with N, Vcc with GND, and hole with electron. The construction of the present invention is used at the silicon substrate using epitaxial growth.

Next, an application circuit of semiconductor temperature sensor of the present invention is described.

FIG. 21 is a circuit diagram inputting output terminal Vout of the circuit diagram shown in FIG. 3 to a voltage follower amplifier 13 and connecting output terminal of the voltage follower amplifier 13 to output pad 14. The voltage follower amplifier is formed in the same semiconductor substrate by bipolar process or MOS process. As the voltage follower amplifier 13 is equal to almost all input voltage, output of the temperature sensor is picked up with fidelity to outside. Although it is possible to let an operational amplifier replacing the voltage follower amplifier 13 and to amplify output of the temperature sensor in order to pick up to outside, it is need to make the deviation constant because the gain has temperature characteristics. Although it is possible to connect to output pad not through the operational amplifier, Vout changes when load capacity is large and load resistance is small.

In FIG. 22, each output is gained from emitter of each bipolar of the embodiment in FIG. 3. Emitter terminals of bipolar transistors 7, 8, and 9 are connected to the input terminals of the voltage follower amplifier 13 respectively, output terminals of three voltage amplifiers 13 are output pads 14.

In the semiconductor temperature sensor, one semiconductor temperature sensor is able to provide more than two kinds of different sensibility and output voltage at the same time. For example, if low voltage range is required, output of the first transistor is used. If high sensibility is required, output of the after third transistor is used. In the embodiment, it is possible to connect to output pads 14 not through operational amplifiers. The operational amplifiers may have gains.

FIG. 23 shows a structure that emitter terminal of each bipolar transistor of the embodiment in FIG. 3 can be changed using a switch element 15. Because of that, as only one voltage follower amplifier 13 is needed, current consumption is small. The control terminal of the switch element 15 is connected to input pad for control, and can select output from outside. Comparing with the example of FIG. 22, as semiconductor temperature sensor has one amplifier, it is no need to consider offset deviation of the voltage follower amplifier 13.

In FIG. 23, it is possible to remove the switch element 15 and to select emitter terminal connecting to input terminal of the voltage follower amplifier 13 by Aluminum (Al) mask or silicon mask. A product having three kinds of sensibility is made by only one mask in that way.

In the embodiment, it is possible to connect to output pads 14 not through operational amplifiers. The operational amplifiers may have gains.

Figure 24:
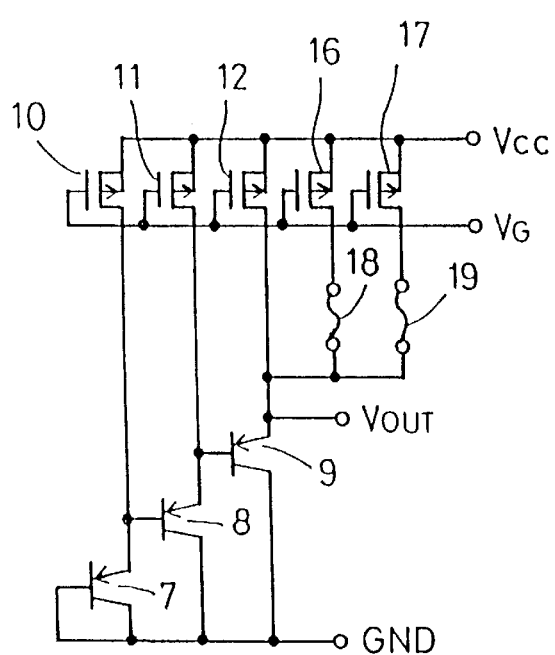
FIG. 24 is a circuit diagram of the twelfth embodiment of semiconductor temperature sensor of the present invention.

FIG. 24 is a circuit diagram of the twelfth embodiment of semiconductor temperature sensor adjustable output voltage or sensibility by trimming current of current source. In FIG. 24, three MOS transistors 12, 16, and 17 of current source are connected to emitter of bipolar transistor 9. MOS transistors 16 and 17 among these transistors are connected to emitter of bipolar transistor 9 through fuses 18 and 19 capable of cutting by laser trimming.

Figure 25:
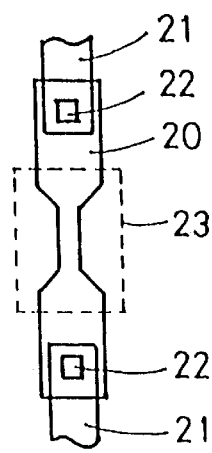
FIG. 25 is a plan view of fuse used in semiconductor temperature sensor of the present invention.

Fuses 18 and 19 have, for example, a structure like FIG. 25. Polysilicon wiring 20 is connected to Aluminum (Al) wiring 21 through contact 22. AL wiring 21 is connected to emitter electrode of bipolar transistor 9 and drain electrodes of MOS transistor 16 and 17 respectively. Center portion of polysilicon wiring 20 is a portion applied by laser and is made thin to cut easily. Symbol 23 is an opening portion of passivation protect film for laser to transmit easily.

If it is designed so that a ratio of drain current of MOS transistor 16 to MOS transistor 17 is 1 to 2, current flowing emitter of bipolar transistor 9 can be selected among four kinds of which may or may not include fuse 18 and fuse 19. At this time, four kinds of current is gained at equal space. Therefore, four kinds of outputs Vout are gained at equal space corresponding to the four cases. Four kinds of sensibility is similarly gained.

Next, a way of trimming the output voltage Vout is described.

Output voltage Vcc of each temperature sensor is measured setting a semiconductor wafer which temperature sensor is formed in at determined temperature T [° C.]. Fuse 16 or 17 is cut so that a difference between output voltage Vout measured at T [° C.] and target of Vout at T [° C.] becomes minimum. Change value of output voltage Vout, when current flowing through emitter of bipolar transistor 9 changes, is calculated in advance from formula (1) or measured value, and then from the measured value, which fuse must be cut is determined like above-mentioned.

Using the above-mentioned way, deviation of output voltage Vout by deviation of production can be corrected in every temperature sensor, and it is possible to guarantee high accurate temperature not decreasing yield.

In case of trimming for sensitivity, calculating sensitivity from output voltage of temperature sensor calculated by two kinds of temperature of semiconductor wafer where temperature sensor is formed in, and then fuses 16 or 17 may be cut so that difference between the calculated density and target density set in advance becomes minimum. In the above-mentioned twelfth embodiment, although emitter current of the third bipolar transistor 9 is adjusted, it is possible to make a circuit adjusting emitter current of the first or second bipolar transistor 7 or 8.

Figure 26:
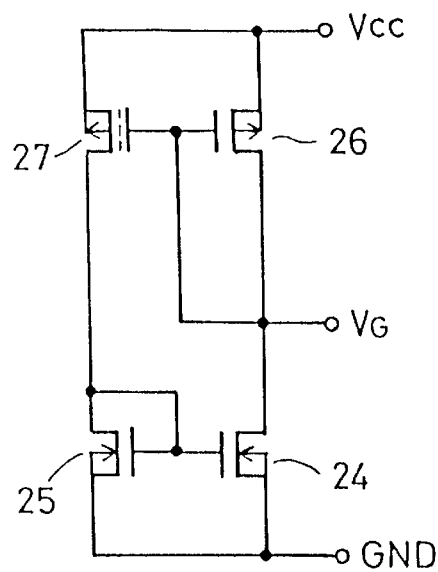
FIG. 26 is a circuit diagram of reference voltage circuit used in semiconductor temperature sensor of the present invention.

FIG. 26 is a circuit diagram showing an example of difference voltage circuit for generating gate voltage VG of circuits of FIGS. 4 and 24. When NMOS transistors 24 and 25 have the same characteristics, absolute value of threshold voltage VTP of PMOS transistor 26 is set larger than absolute value of threshold voltage VTPL of PMOS transistor 27, and all MOS transistors are saturated, the following equation is defined.

$$Vcc\_VG \approx VTP+(K1/K2)^{1/2}/(1\_(K1/K2)^{1/2} \times (VTP\_VYPL) \quad (2)$$

Here, K1 and K2 are transistor gain constants of PMOS transistors 27 and 26 respectively.

Figure 27:
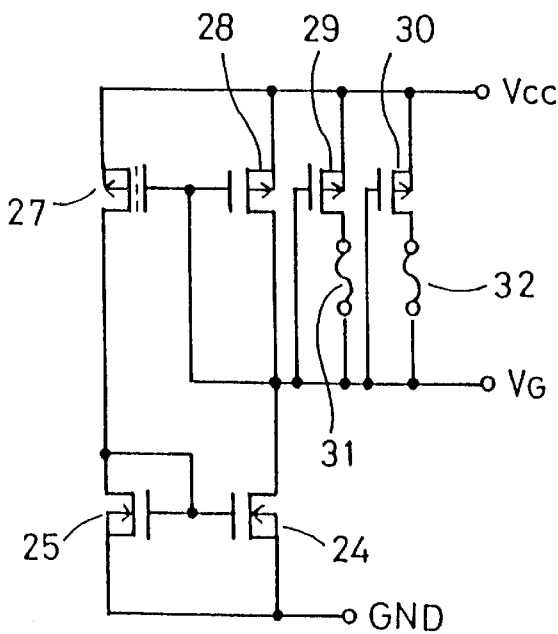
FIG. 27 is a circuit diagram of reference voltage circuit used in semiconductor temperature sensor of the present invention.

FIG. 27 is a circuit diagram of reference voltage circuit capable of trimming based on the circuit of FIG. 26. PMOS transistors 29 and 30 are connected to PMOS transistor 28 in parallel through fuses 31 and 32 respectively, and the gate voltage is equal to gate voltage of PMOS transistor 28.

PMOS transistor 26 is equivalent to the circuit which PMOS transistors 28, 29, and 30 are connected in parallel when fuses 31 and 32 are not cut defining transistor gain constant of PMOS transistors 28, 29, and 30 as K3, K4, and K5. Defining in equation (2) as following, VG is calculated.

$K2=K3+K4+K5$

That is: when only fuse 31 is cut, $K2=K3+K5$ when only fuse 32 is cut, $K2=K3+K4$ and when fuses 31 and 32 are cut, $K2=K3$ Thus four kinds of VG are gained. Combining the reference voltage circuit and the circuit of FIG. 4, it is possible to trim output voltage or sensibility of temperature sensor. It means that it is possible to trim the output voltage or the sensibility because drain current of PMOS transistors 10, 11, and 12 of current sources changing VG. Trimming is the similar way as the fourth embodiment.

In the above explanation, it is possible to trim more accurately increasing the numbers of fuse and MOS transistor. It is possible to trim using switches for fuses.

Figure 28:
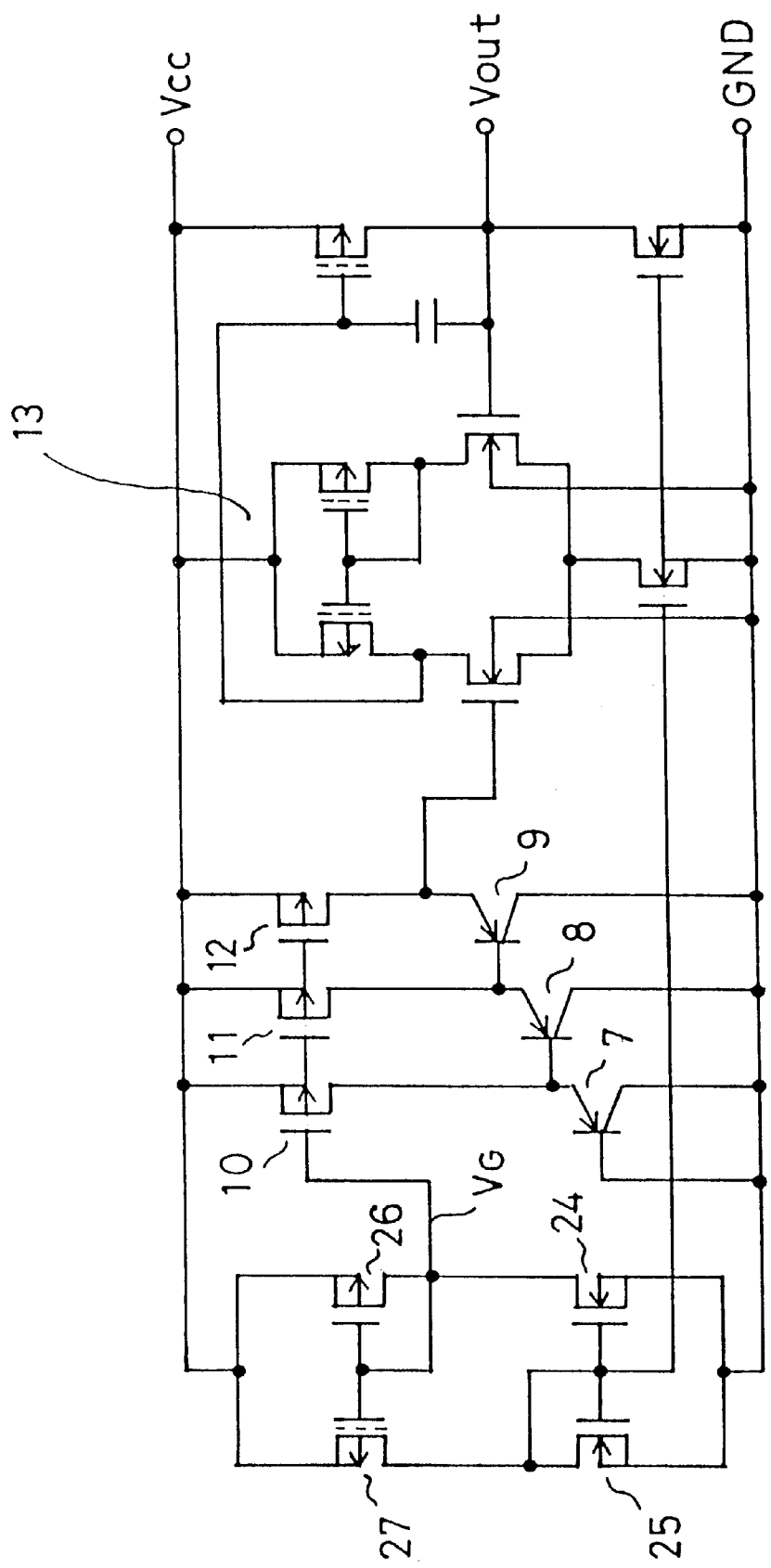
FIG. 28 is a circuit diagram of the thirteenth embodiment of semiconductor temperature sensor of the present invention.

FIG. 28 is a circuit diagram of the thirteenth embodiment of semiconductor temperature sensor in the present invention. The circuit is combined by the reference voltage source of FIG. 10 and the circuit of FIG. 21 which constant current sources 4, 5, and 6 are formed by NMOS transistors. Differential input portion :of voltage follower amplifier 13 is formed by NMOS transistor. Common gate of PMOS transistors 26 and 27 of reference voltage source is connected to gates of PMOS transistors 10, 11, and 12, common gate of NMOS transistors 24 and 25 supplies bias voltage of voltage follower amplifier 13.

As differential input portion of voltage follower amplifier 13 is formed by NMOS transistor, it is possible to minimize the difference between the maximum of emitter output voltage of bipolar transistor 9 inputting to voltage follower amplifier 13 and power source voltage Vcc. It is possible to keep the sensibility constant at wide temperature range and at low power source voltage Vcc. If threshold voltage of NMOS transistors forming voltage follower amplifier 13 is set less than 0.6 V, sensibility is kept constant to high temperature as minimum differential input voltage is decreased. If threshold voltage of NMOS transistors forming voltage follower amplifier 13 is set more than –0.6 V, sensibility is kept constant to low temperature as maximum differential input voltage is increased.

Actually, sensibility of –8.3 mV/° C. is gained using three bipolar transistors, at power source voltage of 2.4 V, and at temperature range of –40° C. to 100° C. As described above, the present invention provides semiconductor temperature sensor having low cost, small current consumption, small deviation of detecting voltage, superior anti-noise, and superior linearity of detecting voltage. If the number of transistor is increased, anti-noise and linearity of detecting voltage do not become bad.

Even at more than 80° C., the semiconductor temperature sensor having superior linearity is provided. Plural of different sensibilities and output voltages are gained from one temperature sensor.

Deviations of output voltage and sensibility by deviation of production is corrected at every temperature sensor, and it is possible to guarantee high accurate temperature without decreasing yield.

Further, high sensibility is gained at low power source voltage and at wide temperature range.

What is claimed is:

1. A method for producing a semiconductor temperature sensor, comprising the steps of:
    forming a plurality of PNP bipolar transistors and PMOS transistors so that a base region of each of the PNP bipolar transistors and a corresponding N-well region of each of the PMOS transistors are formed at the same time; and
    connecting the PNP bipolar transistors in a Darlington connection.

2. A method according to claim 1; wherein the step of providing a plurality of PNP bipolar transistors comprises providing a plurality of PNP bipolar transistors having a current-amplification factor greater than 20.

3. A method according to claim 1; wherein the step of providing a plurality of PNP bipolar transistors comprises providing a plurality of PNP bipolar transistors each having a base region having an impurity concentration less than $2 \times 10^{16}$ cm$^{-3}$.

4. A method for producing a semiconductor temperature sensor, comprising the steps of: forming a plurality of PNP bipolar transistors and PMOS transistors so that an emitter region of each of the PNP bipolar transistors and corresponding source and drain regions of each of the PMOS transistors are formed at the same time; and connecting the PNP bipolar transistors in a Darlington connection.

5. In a method for producing a semiconductor temperature sensor having a plurality of independent current sources, a plurality of PNP bipolar transistors connected to form a Darlington circuit and having main electrodes each connected to one of the current sources, each of the PNP bipolar transistors having a base electrode some of which are connected to respective main electrodes of another of the PNP bipolar transistors, a plurality of operational amplifiers having a plurality of differential input portions comprised of PMOS transistors and having a plurality of input terminals each connected to a respective one of the main electrodes of the PNP bipolar transistors which are not connected to the PNP bipolar transistor base electrodes, and a plurality of output pads each connected to a respective output terminal of each of the operational amplifiers, the improvement comprising the step of: forming the PNP bipolar transistors and the PMOS transistors so that a base region of each of the PNP bipolar transistors and a corresponding N-well region of each of the PMOS transistors are formed at the same time.

6. A method according to claim 5; wherein each of the PNP bipolar transistors has a current-amplification factor greater than 20.

7. A method according to claim 5; wherein each of the PNP bipolar transistors has a base region having an impurity concentration less than $2 \times 10^{16}$ cm$^{-3}$.

8. In a method for producing a semiconductor temperature sensor having a plurality of independent current sources, a plurality of PNP bipolar transistors connected to form a Darlington circuit and having main electrodes each connected to one of the current sources, each of the PNP bipolar transistors having a base electrode some of which are each connected to respective main electrodes of another of the PNP bipolar transistors, a plurality of operational amplifiers having a plurality of differential input portions comprised of PMOS transistors and having a plurality of input terminals each connected to a respective one of the main electrodes of the PNP bipolar transistors which are not connected to the PNP bipolar transistor base electrodes, and a plurality of output pads each connected to a respective output terminal of each of the operational amplifiers, the improvement comprising the step of: forming the PNP bipolar transistors and the PMOS transistors so that an emitter region of each of the PNP bipolar transistors and corresponding source and drain regions of each of the PMOS transistors are formed at the same time.

9. A method for producing a semiconductor temperature sensor, comprising the steps of: forming a plurality of NPN bipolar transistors and NMOS transistors so that a base region of each of the NPN bipolar transistors and a corresponding P-well region of each of the NMOS transistors are formed at the same time; and connecting the NPN bipolar transistors in a Darlington connection.

10. A method for producing a semiconductor temperature sensor, comprising the steps of: forming a plurality of NPN bipolar transistors and NMOS transistors so that an emitter region of each of the NPN bipolar transistors and corresponding source and drain regions of each of the NMOS transistors are formed at the same time; and connecting the NPN bipolar transistors in a Darlington connection.

11. A method for producing a semiconductor temperature sensor, comprising the steps of: forming a plurality of PNP bipolar transistors and PMOS transistors so that an emitter region of each of the PNP bipolar transistors and corresponding source and drain regions of each of the PMOS transistors are formed at the same time; and connecting the PNP bipolar transistors in a Darlington connection.

12. A method according to claim 11; wherein the step of forming a plurality of PNP bipolar transistors comprises providing a plurality of-PNP bipolar transistors having a current-amplification factor greater than 20.

13. A method according to claim 11; wherein the step of forming a plurality of PNP bipolar transistors comprises providing a plurality of PNP bipolar transistors each having a base region having an impurity concentration less than $2 \times 10^{16}$ cm$^{-3}$.

14. A method for producing a semiconductor temperature sensor, comprising the steps of: forming a plurality of NPN bipolar transistors and NMOS transistors so that an emitter region of each of the NPN bipolar transistors and corresponding source and drain regions of each of the NMOS transistors are formed at the same time; and connecting the NPN bipolar transistors in a Darlington connection.

15. In a method for producing a semiconductor temperature sensor having a plurality of independent current sources, a plurality of NPN bipolar transistors connected to form a Darlington circuit and having main electrodes each connected to one of the current sources, each of the NPN bipolar transistors having a base electrode some of which are connected to respective main electrodes of another of the NPN bipolar transistors, a plurality of operational amplifiers having a plurality of differential input portions comprised of NMOS transistors and having a plurality of input terminals each connected to a respective one of the main electrodes of the NPN bipolar transistors which are not connected to the NPN bipolar transistor base electrodes, and a plurality of output pads each connected to a respective output terminal of each of the operational amplifiers, the improvement comprising the step of: forming the NPN bipolar transistors and the NMOS transistors so that a base region of each of the NPN bipolar transistors and a corresponding P-well region of each of the NMOS transistors are formed at the same time.

16. A method according to claim 15; wherein each of the NPN bipolar transistors has a current-amplification factor greater than 20.

17. A method according to claim 15; wherein each of the NPN bipolar transistors has a base region having an impurity concentration less than $2 \times 10^{16}$ cm$^{-3}$.

18. In a method for producing a semiconductor temperature sensor having a plurality of independent current sources, a plurality of NPN bipolar transistors connected to form a Darlington circuit and having main electrodes each connected to one of the current sources, each of the NPN bipolar transistors having a base electrode some of which are each connected to respective main electrodes of another of the NPN bipolar transistors, a plurality of operational amplifiers having a plurality of differential input portions comprised of NMOS transistors and having a plurality of input terminals each connected to a respective one of the main electrodes of the NPN bipolar transistors which are not connected to the NPN bipolar transistor base electrodes, and a plurality of output pads each connected to a respective output terminal of each of the operational amplifiers, the improvement comprising the step of: forming the NPN bipolar transistors and the NMOS transistors so that an emitter region of each of the NPN bipolar transistors and corresponding source and drain regions of each of the NMOS transistors are formed at the same time.

* * * * *